United States Patent [19]

Brown et al.

[11] Patent Number: 5,205,896

[45] Date of Patent: Apr. 27, 1993

[54] COMPONENT AND SOLDER PREFORM PLACEMENT DEVICE AND METHOD OF PLACEMENT

[75] Inventors: Raymond L. Brown, Fountain Valley; Gerald B. Smith, Huntington Beach, both of Calif.

[73] Assignee: Hughes Aircraft Company, Los Angeles, Calif.

[21] Appl. No.: 829,665

[22] Filed: Feb. 3, 1992

[51] Int. Cl.⁵ .................. B23K 17/00; B23K 20/00
[52] U.S. Cl. ...................... 156/297; 156/230; 156/290; 156/285; 156/73.6; 228/245; 228/246; 228/56.3
[58] Field of Search .............. 156/290, 297, 230, 73.6, 156/285, 249

[56] References Cited

U.S. PATENT DOCUMENTS

| | | | |
|---|---|---|---|
| 3,355,078 | 11/1967 | Smith | 269/21 X |
| 3,516,155 | 6/1970 | Smith | 228/56.3 X |
| 3,899,379 | 8/1975 | Wanesky | 156/297 X |
| 4,209,893 | 7/1980 | Dyce | 228/56.3 X |
| 4,216,350 | 8/1980 | Reid | 228/56.3 X |
| 4,462,534 | 7/1984 | Bitaillou | 228/180 A X |
| 4,774,760 | 10/1988 | Seaman | 228/246 X |
| 4,871,110 | 10/1989 | Fukasawa | 228/245 X |
| 4,898,320 | 2/1990 | Dunaway | 228/245 |
| 5,118,027 | 6/1992 | Braun | 228/245 X |

Primary Examiner—David A. Simmons
Assistant Examiner—Charles Rainwater
Attorney, Agent, or Firm—Terje Gudmestad; Jeannette M. Walder; W. K. Denson-Low

[57] ABSTRACT

Discrete solder preforms (28, 14a, 14b, 14c) are quickly and accurately placed on substrates (10) to be soldered by means of a foil sheet (24) apertured (26) with the pattern of preform placement. The foil sheet has a vacuum drawn through its apertures, and a number of discrete solder preforms are randomly projected from a vibratory membrane (38) up against the foil to be attached to the foil at each of its apertures. Then the foil sheet with its vacuum attached solder preforms (28, 14a, 14b, 14c) is moved into registration with the flux pattern (12a, 12b, 12c) pre-printed on the substrate (10), and all of the vacuum attached preforms are simultaneously positioned down upon the flux areas of the substrate where they remain when the vacuum is released. Planarity of the thin foil is maintained by a flat somewhat rigid but porous backing member (32) secured to the foil.

17 Claims, 2 Drawing Sheets

COMPONENT AND SOLDER PREFORM PLACEMENT DEVICE AND METHOD OF PLACEMENT

BACKGROUND OF THE INVENTION

1. Field of the Invention

The present invention relates to methods and apparatus for dispensing and distributing discrete small geometric solids and more particularly concerns automatic handling and positioning of small geometric solids in a pre-selected pattern.

2. Description of Related Art

It is often necessary to distribute small geometric solids for use in various types of processes. Distribution of a number of similar items to selected areas or in selected patterns is a frequently useful operation. For example, in some types of manufacture of electronic circuit components, small components and chips are positioned on a substrate in pre-selected patterns or locations and secured to the substrate by soldering. Leadless chip carriers are placed on a solder bump that is carried by a substrate and then soldered in place, thereby attaching the carriers to the substrate. At present this procedure of attaching small items, such as leadless chip carriers, solder preforms, components and chips to the substrate is carried out by two steps: first, the manual placement of individual spherical solder preforms in a pre-selected pattern or in pre-selected locations at which the component chips or chip carriers are to be attached. The manual positioning of such small elements (preforms are often in the range of 0.010 inches in diameter) and maintaining all of them in place while others are manipulated into position is tedious, laborious, time consuming, expensive and subject to human error. Additionally, electrostatic forces can cause clumping of items, making it difficult to place single discrete items at each location. Second, the components chips and chip carriers are placed manually or with the aid of a vacuum pick up. To aid an operator in placing the chips (or chip carriers), the chips are placed in a pallet having preformed recesses for retaining the chips. A vacuum pick up removes the chips one at a time for placement on the board or substrate where they will be attached by solder.

Accordingly, it is an object of the present invention to provide for distribution or placement of small items or geometric solids while avoiding or minimizing problems set forth above.

SUMMARY OF THE INVENTION

In carrying out principles of the present invention in accordance with a preferred embodiment thereof a plurality of small items are dispersed by placing them on a membrane and vibrating the membrane to impart sufficient kinetic energy to overcome electrostatic attractive forces, thereby producing a ballistically projected distribution of discrete items from the membrane. In one application the ballistically projected discrete items are distributed to individual seats of an item holder. The item holder has a plurality of item seats formed therein in a pattern that matches the pattern of locations on a substrate to which a plurality of items are to be attached. A number of items are received by the holder and detachably secured thereto at the pattern seats, and then the holder together with all of its items is moved into a position adjacent to and in registration with the substrate pattern to allow all of the items to be positioned at their predetermined locations at the same time. According to a feature of the invention, the item holder is a thin sheet having a pattern of apertures through which a vacuum is drawn to detachably secure spherical items that are ballistically projected up against the bottom of the item holder.

DESCRIPTION OF THE PREFERRED EMBODIMENT

The present invention is applicable to different operations in which small items are agitated and dispersed. It is particularly useful where small spherical parts are to be individually positioned in predetermined patterns on some type of device and can be adapted to position chips and other parts. Although the invention is of wide application, it has been initially embodied in apparatus for placing solder preforms onto a substrate pre-printed with a pattern of flux areas, and, accordingly will be described, for purposes of exposition, in connection with such an application.

Figure 1:
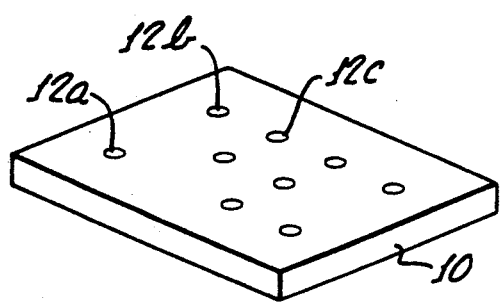
FIG. 1 illustrates an exemplary substrate having a flux pattern pre-printed thereon.
Figure 2:
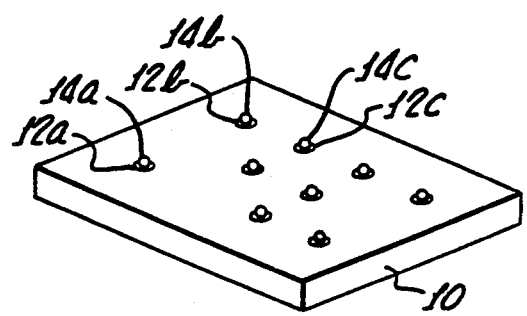
FIG. 2 illustrates the substrate and its flux pattern with spherical solder preforms in place.

Referring now to FIG. 1, a substrate 10 has pre-printed on an upper side thereof, as by silk screening or masking and deposition techniques, a plurality of small spots of a solder flux forming a pre-printed flux location pattern indicated at 12a, 12b, 12c etc. It is the purpose of the exemplary embodiment of the invention described herein to position a single spherical solder preform, such as one of the preforms 14a, 14b, 14c etc. (FIG. 2) upon an individual one of the flux areas of the substrate 10. The solder preforms are of very small size and light weight, having a diameter in one example of 0.010". For this reason manual positioning of these small parts may be difficult and time consuming, particularly because when the last few parts are being positioned, vibration, air motion or other conditions may occur to disturb earlier placed parts that may not have been properly secured to the substrate.

Figure 3:
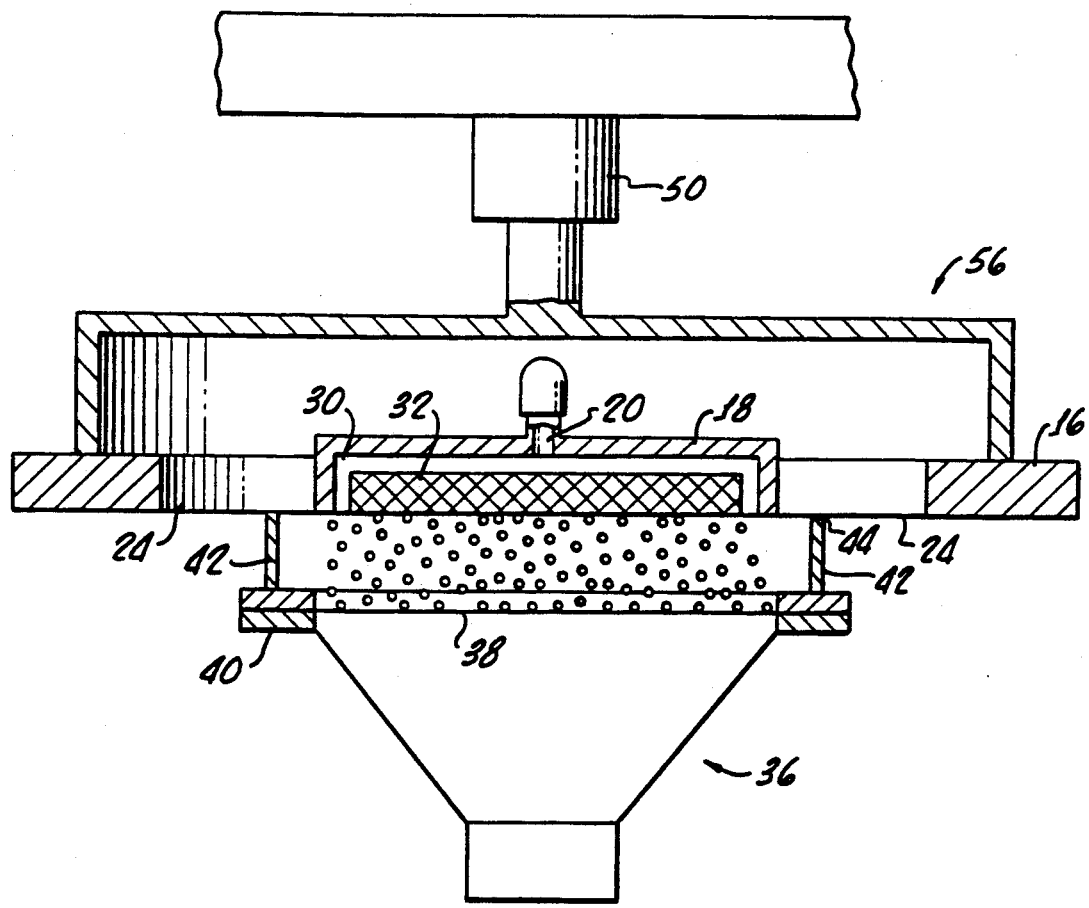
FIG. 3 illustrates a fixture embodying principles of the present invention for detachably securing small items to an item holder.
Figure 4:
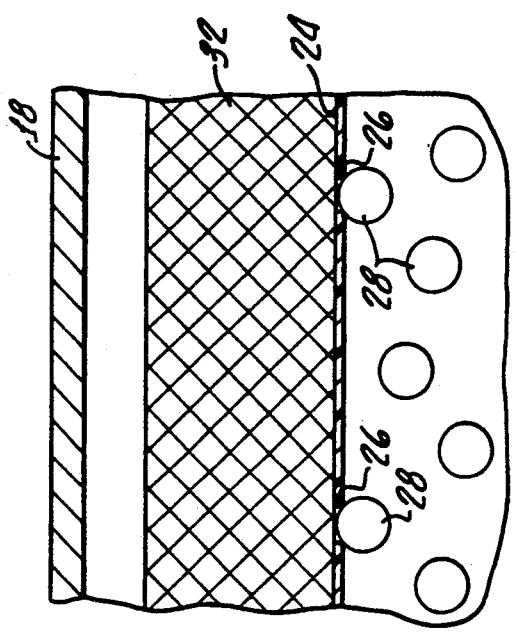
FIG. 4 is an enlarged detail illustrating the manner in which items are projected to and secured by the item holder.

In accordance with the present invention, as illustrated in an exemplary embodiment thereof shown in FIG. 3, a support 16 in the form of a rigid annulus or rectangular perimetric frame carries a vacuum housing 18, having a vacuum port 20 and an open lower face. The lower side of the vacuum housing is closed by a thin sheet of multi-aperture foil 24 that is secured at its periphery to rigid support elements 16 and extends completely across the open side of the vacuum chamber to seal the chamber so that a vacuum may be drawn therein. The sheet 24 forms a preform holder in the form of a thin sheet of metal foil, having a thickness in the order three to five mils, for example, and which has been pre-drilled, etched or otherwise processed to form a pattern of holes therein. In one embodiment the foil comprises a sheet of stainless steel of 3 to 5 mils thickness having a pre-defined pattern of photo-chemically etched holes. This pattern is identical to the pattern of pre-printed flux areas 12a, 12b and 12c, at which the pre-solder preforms are to be positioned. Each of the holes 26 (see FIG.4) formed in the thin foil sheet 24 is of circular section and has a diameter slightly less than the diameter of the spherical solder preforms 28 shown in FIG. 4.

Fixedly secured to the upper side of sheet 24, within the vacuum chamber 30 defined by housing 18 and perforated foil sheet 24, is a porous backing member 32, which may be made of a porous stone, ceramic or plastic, such as a type commonly used for micro filtration. The backing member is self-supporting and substantially rigid, with a precisely flat surface positioned against and adhesively secured to the foil 24 along the outer periphery of the backing member, to thereby maintain planarity of the thin foil sheet when a vacuum is drawn on the sheet.

A vibratory device, such as a loudspeaker 36, having a cone 34, magnetic driver 37 and a front frame 40, is fixedly mounted below the foil sheet and below the vacuum chamber. The speaker is mounted to a fixed support (not shown) which is attached to speaker frame 40. A flexible membrane 38 extends across and substantially completely closes the speaker aperture, confining a sealed volume of air between cone 34 and the membrane. The membrane 38 is radially tensioned and fixedly secured as by adhesive or the like to the speaker peripheral frame 40. Secured to and upstanding from the speaker frame 40 is a relatively rigid, self-supporting air permeable skirt 42 which has its peripheral upper edge 44 lying in a plane and positioned in air tight contact with the lower surface of foil sheet 24. The skirt 42 extends continuously around the entire speaker frame, and thus helps to define a preform projection chamber 46 surrounded by the skirt and located between the perforated foil sheet 24 and vibratory membrane 38. Projection chamber 46 is arranged to contain a number of the preforms that are to be attached to the foil. The number of preforms in the chamber is greater than the number of seats or holes formed in the foil. The arrangement is such that the entire vacuum chamber, together with frame 16 and foil preform holder 24, may be lifted and completely separated from the speaker and its upstanding skirt 42.

In operation, with the vacuum housing and foil raised above the speaker and its skirt, a number of solder preforms are loaded into the projection chamber 46, on to the upper surface of membrane 38, substantially covering the membrane surface, but no more than one layer (of preforms) deep. The preform holder assembly, comprising the vacuum housing frame and foil sheet, is lowered to rest upon the skirt 42 and close the projection chamber 46. Then a vacuum is drawn through port 20 in the vacuum chamber 30 to draw air through the skirt 42, through the foil aperture seats 26 and through porous backing 32, while the speaker is operated to vibrate the membrane 38. An electrical audio signal to driver 37 causes vibration of the speaker cone, which, in turn, causes vibration of the air volume confined between the cone and membrane, thereby vibrating the membrane in directions perpendicular to its surface. Vibration of membrane 38, which is positioned in a horizontal plane with the spherical solder preforms resting on top of the membrane, effectively causes random ballistic projection and dispersion of discrete small light weight solder preforms upwardly toward and against the foil sheet 24. The amplitude and frequency of the electrical signal applied to the speaker are arranged to cause the small solder preforms to be projected up to and against the under surface of the foil 24. Vibration frequency is chosen empirically to be close to the natural frequency of the system, e.g. by selecting that frequency for which the preforms are projected highest above the membrane. Amplitude of vibration is chosen, also empirically, to be a value at which the preforms just reach the foil so as to minimize rebound from the foil and to ensure that discrete preforms will be sufficiently close to be captured by the vacuum. Thus discrete preforms are projected upwardly, in a ballistic trajectory that peaks at the foil to effectively provide a kinetic cloud of discrete preforms The vacuum that is drawn through the holes in the foil causes one preform to be secured to each of the holes in the foil. When all holes in the foil 24 have received a spherical solder preform the speaker is turned off, but the vacuum remains drawn on the foil and in the vacuum chamber to retain the solder preforms on the foil seats. After a predetermined period of time the speaker is turned off and the entire assembly may be lifted to visually determine that all holes seat a preform. Alternatively, completion of loading of preforms in all foil holes may be signalled by monitoring total vacuum drawn or by projecting light through the foil holes. When all foil holes seat a preform, the entire movable holder assembly, including frame 16, vacuum chamber 18, and preform holder foil 24, together with the preform parts that are vacuum adhered to each of the holes of the foil, is lifted from the speaker and the projection chamber 46.

Figure 5:
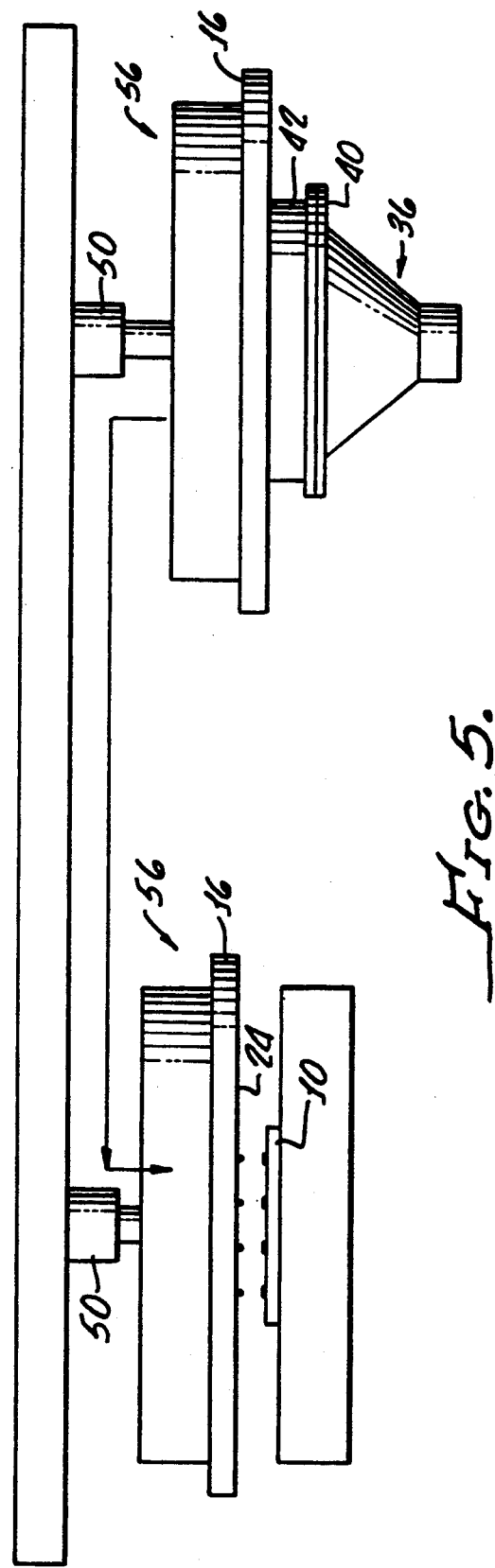
FIG. 5 schematically illustrates a system in which a carrier moves the item loading and holding fixture from an item loading station to an item positioning station.

FIG. 5 schematically illustrates a carriage 50 that supports the preform holder assembly of frame, vacuum chamber and preform foil sheet for bi-directional vertical motion and for lateral motion from the speaker and projection chamber at a part loading station 54. The carriage 50 is movable between station 54 and a preform positioning station 56 at which the preform holder assembly is positioned directly above and adjacent to the substrate 10 bearing pre-printed flux pattern. The foil 24 with its vacuum adhered preforms has its pattern of preforms precisely registered with the pattern of pre-printed flux areas on the substrate 10. Carriage 50 is manipulated to lower the preform holder assembly of frame vacuum chamber and foil to physically position the spherical preforms in their planar and congruent pattern directly upon the identical pre-printed flux pattern on the substrate 10. The preform holder assembly may be mounted to carriage 50 for small amounts of adjustment about a vertical axis and in two mutually orthogonal horizontal directions to ensure registration of the preform and flux patterns. Alternatively, the substrate may be mounted for adjustment about a vertical axis and along two orthogonal directions.

Upon attainment of the lower position of the preform holder assembly, wherein the spherical preforms are in light contact with the pre-printed flux, the vacuum is turned off, thereby releasing the preforms from the foil aperture seats. After turning off the vacuum, with the preforms in light contact with the somewhat tacky flux, the preform holder assembly may be tapped lightly to ensure that all preforms remain secured to the sticky flux and are released from the foil. The preform holder assembly is then raised and shuttled back to the preform loading station 54 where the projection chamber is again loaded with preforms and the preform holder assembly lowered to once again load a number of preforms onto the under surface of the preform holder foil so that additional substrates with their pre-printed flux patterns may have solder preforms positioned thereon. Once positioned on the preprinted flux areas, the preforms are melted to form solder bumps which may be used in a conventional manner to attach leadless chip carriers.

The foil sheet, which may be termed a "foil stencil", together with its fixedly attached frame 16, can be readily changed and can be designed with a pattern of seating apertures to accommodate any selected pattern of spherical preform placement desired. Many different types of preform sizes and materials may be used, and much waste is eliminated by the process. The described foil sheet supported by a porous backing member is preferred for ease of formation of hole patterns in the foil and for ready interchangeability of foil sheets with different patterns. Nevertheless, a thicker, more rigid and self supporting member may be used in the place of both foil sheet and its backing with an appropriate hole pattern drilled therein.

The apparatus and method described herein may be employed when volume controlled pre-tinning is required. In such an arrangement a predetermined number of selected size of solder preforms having a selected spacing is placed on the substrate so that when melted a uniform coating of controlled volume will be provided on the substrate surface.

The apparatus and method described herein may also be employed to position larger items, such as chips, by appropriately modifying the holder and aperture size of the openings in the holder foil, and by adjusting the resonant frequency of the vibratory membrane.

What is claimed is:

1. A method of placing discrete items in a predetermined pattern on a substrate comprising the steps of:
   providing an item holder having a pattern of item areas conforming to said predetermined pattern,
   providing a kinetic cloud of discrete items,
   detachably securing those items that approach said item holder at said item areas thereof,
   positioning said item holder with said items adjacent said substrate with said item pattern of said holder in registration with said predetermined pattern on said substrate,
   moving said item holder with the detachably secured items thereon to said substrate until said items contact said substrate,
   releasing said items from said item holder, and
   removing said item holder from said substrate and items thereon.

2. The method of claim 1 wherein said item holder comprises a thin sheet having a plurality of holes therein, each smaller than a dimension of one of said items, and wherein said step of detachably securing said items to said item holder comprises drawing a vacuum through the holes in said item holder.

3. The method of claim 1 wherein said step of providing a kinetic cloud comprises the step of imparting sufficient kinetic energy to said items to project a plurality of said discrete items randomly toward and adjacent said item holder.

4. The method of claim 3 wherein said step of randomly projecting discrete items comprises the step of positioning a plurality of items on a vibratory membrane and vibrating the membrane to project the items toward said part holder.

5. The method of claim 4 wherein said item holder comprises a thin sheet having a plurality of holes therein, each smaller than a dimension of one of said items, wherein said step of detachably securing said items to said item holder comprises drawing a vacuum through the holes in said item holder and wherein said step of positioning said item holder adjacent said substrate comprises the steps of moving said item holder toward said substrate so as to register the pattern of the item holder with the substrate pattern while maintaining said vacuum to detachably secure items to the item holder, and terminating said vacuum when the items are at said predetermined substrate pattern.

6. The method of claim 2 wherein said step of drawing vacuum comprises the step of strengthening said item holder with a porous backing and applying said vacuum to said part holder through said porous backing.

7. The method of claim 4 wherein said membrane has a substantially planar surface and wherein said membrane is vibrated in directions transverse to said surface.

8. The method of claim 4 including the step of radially tensioning said membrane while it is vibrated.

9. The method of claim 4 wherein said step of vibrating the membrane comprises providing a loudspeaker having a frame and a vibratory cone, affixing the membrane to said frame to enclose a volume of air between the cone and membrane, and driving said loudspeaker.

10. Apparatus for patterned placement of items on a substrate comprising:
   an item holder having a predetermined pattern of item locations configured and arranged to receive, seat and detachably secure an item,
   means for detachably securing a plurality of items to said item holder with one item being positioned at each of a group of said item locations, said means for securing comprising a vibratory membrane positioned adjacent to but spaced from said item holder and means for vibrating the membrane to project items placed on said membrane toward said item holder,
   means for moving said item holder with items attached thereto into an item positioning location wherein the pattern of item locations on said item holder is in registration with a predetermined pattern of item locations on a substrate, and
   means for releasing the securement of said items to said item holder to thereby position each of said items at an individual one of the item locations of said substrate.

11. The apparatus of claim 10 wherein said item holder comprises a sheet having a plurality of apertures positioned in a predetermined pattern that matches the pattern of item locations on said substrate, each of said apertures comprising one of said item holder locations, and means for drawing a vacuum through said apertures to hold items to said sheet at said apertures.

12. The apparatus of claim 11 wherein said sheet comprises a sheet of foil and a stiffener therefor, said stiffener comprising a relatively stiff and self-supporting porous member secured to said sheet.

13. The apparatus of claim 10 wherein said item holder comprises a vacuum housing defining a vacuum chamber, a thin sheet forming one side of said chamber and having a plurality of apertures extending therethrough in a predetermined pattern, and means for drawing a vacuum in said chamber.

14. The apparatus of claim 13 wherein said sheet comprises a thin sheet of foil and a self-supporting porous backing member in said chamber secured to one side of said foil, whereby vacuum may be drawn through said porous backing member to holes in said foil.

15. The apparatus of claim 11 including means for moving said item holder from said vibratory means and for moving said item holder to a substrate having a predetermined pattern of item locations, means for terminating said vacuum to thereby release items from said item holder when said item holder locations and the items detachably secured thereto are in registration with item locations of said substrate.

16. The apparatus of claim 10 wherein said items comprise generally spherical solder preforms and wherein said item locations of said substrate comprise a printed pattern of solder flux.

17. Apparatus for placing spherical solder preforms onto a substrate pre-printed with a predetermined flux pattern, said pattern comprising:

a thin foil having a plurality of circular holes formed therethrough, said holes forming a pattern that is the same as said flux pattern of said substrate, each of said holes having a diameter less than the diameter of each of said solder preforms, a housing defining a vacuum chamber having said foil sheet forming one side thereof, a vacuum port for decreasing pressure within said vacuum chamber, a stiff porous backing secured to said foil within said chamber, said porous backing having a planar surface that controls planarity of said foil, a frame positioned adjacent said foil and lying in a plane parallel to and spaced from sail foil, a vibratory membrane bridging said frame to form a part projection space between said foil member and said membrane, an air permeable skirt carried by said frame and enclosing said projection space, and means for vibrating said membrane to thereby randomly project discrete spherical preforms within said projection space from said membrane to said metal foil, thereby causing some of said preforms to be attached to said metal foil at said metal foil apertures when vacuum is applied to said vacuum chamber.

* * * * *